US011388846B2

(12) United States Patent
Xie et al.

(10) Patent No.: US 11,388,846 B2
(45) Date of Patent: Jul. 12, 2022

(54) HEAT DISSIPATION FILM, DISPLAY DEVICE AND MANUFACTURING METHOD THEREOF (71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fuzheng Xie, Beijing (CN); Xiaoxia Liu, Beijing (CN); Binfeng Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 302 days.

(21) Appl. No.: 16/610,974

(22) PCT Filed: Jan. 29, 2019

(86) PCT No.: PCT/CN2019/073682
§ 371 (c)(1),
(2) Date: Nov. 5, 2019

(87) PCT Pub. No.: WO2019/242310
PCT Pub. Date: Dec. 26, 2019

(65) Prior Publication Data
US 2021/0368657 A1 Nov. 25, 2021

(30) Foreign Application Priority Data
Jun. 21, 2018 (CN) .......................... 201810643584.2

(51) Int. Cl.
H05K 7/20 (2006.01)
H05K 9/00 (2006.01)

(52) U.S. Cl.
CPC ....... H05K 7/20963 (2013.01); H05K 9/0054 (2013.01); H05K 9/0081 (2013.01)

(58) Field of Classification Search
CPC .................................................. H05K 7/20963
See application file for complete search history.

(56) References Cited

U.S. PATENT DOCUMENTS 4,776,914 A  10/1988  Horikiri
5,427,861 A   6/1995  D'Errico
(Continued)

FOREIGN PATENT DOCUMENTS

CN  102054398 A  5/2011
CN  104053344 A  9/2014
(Continued)

OTHER PUBLICATIONS

First Office Action dated Mar. 15, 2019 for corresponding Chinese application 201810643584.2.

Primary Examiner — Mukundbhai G Patel
(74) Attorney, Agent, or Firm — Nath, Goldberg & Meyer; Joshua B. Goldberg (57) ABSTRACT The present disclosure provides a heat dissipation film, a display device, and a manufacturing method of the display device. The heat dissipation film includes a heat conducting layer and a light shielding layer; an orthographic projection of the light shielding layer in a thickness direction covers an orthographic projection of the heat conducting layer in the thickness direction, and an area of the orthographic projection of the light shielding layer in the thickness direction is larger than an area of the orthographic projection of the heat conducting layer in the thickness direction.

13 Claims, 6 Drawing Sheets (56) References Cited

U.S. PATENT DOCUMENTS 9,985,084 B2 * 5/2018 Yoon .................. H01L 27/3272
2018/0149435 A1 * 5/2018 Lee ........................ B32B 9/045

FOREIGN PATENT DOCUMENTS

| CN | 104991302 A | 10/2015 |
| CN | 206147229 U | 5/2017 |
| CN | 106997115 A | 8/2017 |
| CN | 107101176 A | 8/2017 |
| CN | 108770300 A | 11/2018 |

* cited by examiner

HEAT DISSIPATION FILM, DISPLAY DEVICE AND MANUFACTURING METHOD THEREOF

CROSS-REFERENCE TO RELATED APPLICATION

This is a National Phase Application filed under 35 U.S.C. 371 as a national stage of PCT/CN2019/073682, filed Jan. 29, 2019, an application claiming the benefit of Chinese Patent Application No. 201810643584.2, filed on Jun. 21, 2018, entitled "HEAT DISSIPATION FILM, DISPLAY DEVICE AND MANUFACTURING METHOD THEREOF" to the China National Intellectual Property Administration (CNIPA), the entire contents of each of which are hereby incorporated by reference.

TECHNICAL FIELD

The present disclosure relates to the field of display technologies, and in particular, to a heat dissipation film, a display device, and a manufacturing method of the display device.

BACKGROUND

At present, edges of the cover plate of the display device using the decorative film may leave blank due to the limitation of the attaching process, which may cause light leakage of the display device and affect display.

Therefore, the related art of the existing display devices still need to be improved.

SUMMARY

In one aspect of present disclosure, the present disclosure provides a heat dissipation film for a display device, including: a heat conducting layer and a light shielding layer; wherein, an orthographic projection of the light shielding layer in a thickness direction covers an orthographic projection of the heat conducting layer in the thickness direction, and an area of the orthographic projection of the light shielding layer in the thickness direction is larger than an area of the orthographic projection of the heat conducting layer in the thickness direction.

According to an embodiment of the present disclosure, the heat conducting layer includes a metal layer and a first heat conducting layer, the metal layer being disposed on a surface of the first heat conducting layer away from the light shielding layer.

According to an embodiment of the present disclosure, the heat dissipation film further includes a release layer disposed on at least a portion of an exposed surface of the heat dissipation film.

According to an embodiment of the present disclosure, the release layer includes: a first release layer disposed on a surface of the light shielding layer away from the first heat conducting layer, and a second release layer disposed on a surface of the light shielding layer adjacent to but not covered by the first heat conducting layer.

According to an embodiment of the present disclosure, the release layer further includes a third release layer disposed on a surface of the metal layer away from the first heat conducting layer.

According to an embodiment of the present disclosure, the heat dissipation film further includes an adhesive layer disposed between the metal layer and the third release layer.

According to an embodiment of the present disclosure, the heat conducting layer further includes a second heat conducting layer disposed between the first heat conducting layer and the metal layer.

According to an embodiment of the present disclosure, the light shielding layer is a black tape layer.

According to an embodiment of the present disclosure, an outer circumferential edge of the orthographic projection of the light shielding layer in the thickness direction is located outside an outer circumferential edge of the orthographic projection of the heat conducting layer in the thickness direction.

According to an embodiment of the present disclosure, a distance that each of two ends of the light shielding layer in a length direction exceeding each of two ends of the heat conducting layer in a length direction is in range of 0.5 to 2 mm.

According to an embodiment of the present disclosure, a distance that each of two ends of the light shielding layer in a width direction exceeding each of two ends of the heat conducting layer in a width direction is in range of 0.5 to 2 mm.

According to an embodiment of the present disclosure, the two ends of the light shielding layer opposite to each other in the length direction are aligned with the two ends of the heat conducting layer opposite to each other in the length direction, respectively, and the two ends of the light shielding layer in the width direction exceed the two ends of the heat conducting layer in the width direction, respectively.

In another aspect of the present disclosure, the present disclosure provides a display device including: a cover plate, a display panel disposed on an inner surface of the cover plate; and the heat dissipation film as described above, wherein the heat dissipation film is disposed on a surface of the display panel away from the cover plate, and an edge of a surface of the light shielding layer adjacent to the display panel is connected to an edge of the cover plate.

According to an embodiment of the present disclosure, the display device further includes a middle frame disposed around the display panel, wherein an edge of a surface of the light shielding layer away from the display panel is connected to the middle frame.

In another aspect of the present disclosure, the present disclosure provides a manufacturing method of the above display device. According to an embodiment of the present disclosure, the manufacturing method includes: fixing the heat dissipation film as described above on the surface of the display panel away from the cover plate, and disposing the heat conducting layer in the heat dissipation film away from the display panel; and bending the light shielding layer in the heat dissipation film in a direction toward the cover plate, so as to connect the edge of the surface of the light shielding layer adjacent to the display panel to the edge of the cover plate.

According to an embodiment of the present disclosure, the display device includes the middle frame disposed around the display panel, the manufacturing method further includes: connecting the edge of the surface of the light shielding layer away from the display panel to the middle frame.

DETAILED DESCRIPTION OF THE EMBODIMENTS

Embodiments of the present disclosure are described in detail below. The embodiments described below are exemplary and are only used to explain the disclosure and cannot be understood as limitation to the disclosure.

Figure 1A:
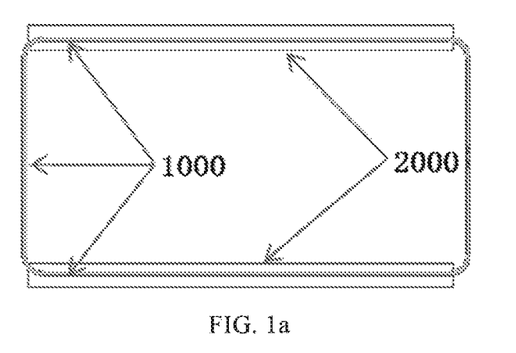
FIG. 1a is a plan sectional structural view showing a display device in the related art.
Figure 1B:
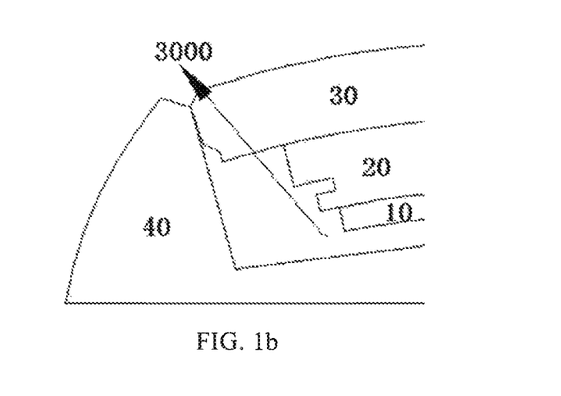
FIG. 1b is a longitudinal sectional structural view showing a portion of the display device in the related art.

In the related art, a display device includes a heat dissipation film 10, a display panel 20, a cover plate 30, and a middle frame 40 (refer to FIG. 1; FIG. 1a is a plan sectional structural view of the display device, and FIG. 1b is a longitudinal sectional structural view of the display device), most of them use a 3D cover plate. In order to overcome the technical problem of ink printing on the 3D cover plate, the cover plate 30 of the display device is often manufactured by attaching a decorative film (Deco Film). However, the cover plate 30 to which the decorative film is attached may leave blank 1000 at the edge of the cover plate 30 due to the limitation of the attaching process. After the display device is assembled, the blank 1000 at the edge of the cover plate 30 may cause light leakage of the display device, affecting the display. For the above technical problems, one solution is to apply ink or paste black tape in the area of the blank 1000. The ink-applied area 2000 or the area where the black tape is pasted can cover the light leakage 3000. However, the process of applying ink or pasting the black tape is cumbersome, and there is a problem of fit tolerance when pasting the black tape, which may not solve the defect of light leakage of the display panel.

Based on this, in one aspect of the present disclosure, the present disclosure provides a heat dissipation film for a display device. According to an embodiment of the present disclosure, referring to FIGS. 2, 3, and 4, the heat dissipation film 10 for a display device includes: a heat conducting layer 100 and a light shielding layer 200; wherein, an orthographic projection of the light shielding layer 200 in a thickness direction covers an orthographic projection of the heat conducting layer 100 in the thickness direction, and an area of the orthographic projection of the light shielding layer 200 in the thickness direction is larger than an area of the orthographic projection of the heat conducting layer 100 in the thickness direction. Since the area of the orthographic projection of the light shielding layer 200 of the heat dissipation film 10 in the thickness direction is larger than the area of the orthographic projection of the heat conducting layer 100 in the thickness direction, when the heat dissipation film 10 is assembled on the display device, the light shielding layer 200 of the heat dissipation film 10 can block the blank existing at the edge of the cover plate 30 of the display device in the related art, and the light shielding layer 200 can also enhance the strength of the display device, thereby improving the anti-impact performance of the display device. Therefore, the heat dissipation film 10 can prevent the light leakage of the display device including such heat dissipation film 10, obtain good sealing property and anti-impact performance, and the manufacturing process is simple.

Figure 2:
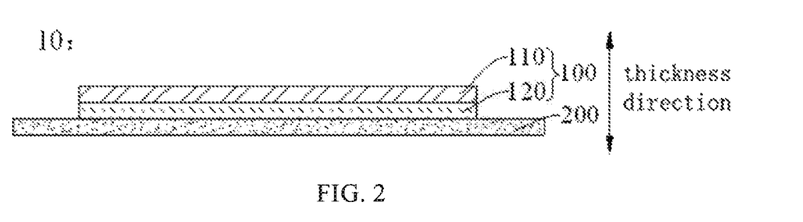
FIG. 2 is a sectional structural view showing a heat dissipation film in one embodiment of the present disclosure.

According to an embodiment of the present disclosure, referring to FIG. 2, the thickness direction refers to a stacking direction of the heat conducting layer 100 and the light shielding layer 200.

According to an embodiment of the present disclosure, referring to FIG. 2, the heat conducting layer 100 includes a metal layer 110 and a first heat conducting layer 120, and the metal layer 110 is disposed on a surface of the first heat conducting layer 120 away from the light shielding layer 200. In other words, the metal layer 110, the first heat conducting layer 120, and the light shielding layer 200 are stacked one on another in order. Thereby, the metal layer 110, the first heat conducting layer 120, and the light shielding layer 200 are stacked together in the thickness direction. Since the heat conducting layer contains a metal layer, it can prevent the occurrence of the stamping, and at the same time, the thermal conductivity can be made good by providing the first heat conducting layer.

According to an embodiment of the present disclosure, the kind of the light shielding layer 200 may be a black tape layer. Thus, by setting the color of the light shielding layer 200 to black, a more effective light-shielding effect can be achieved. By providing the light shielding layer 200 as a tape layer, the heat dissipation film 10 can be made simpler, more convenient and quicker when assembled on a display device, greatly shortening production time and improving production efficiency.

According to an embodiment of the present disclosure, the material of the light shielding layer 200 may be EMBO (netted glue). Since the EMBO itself has a good light-shielding effect and belongs to a tape, it can serve effective light-shielding effect and the heat dissipation film 10 can be made simpler, more convenient and quicker when assembled on a display device, greatly shortening production time and improving production efficiency. The materials are widely available, readily available, and cost-effective, and the EMBO can also be bent for subsequent applications.

According to an embodiment of the present disclosure, the light shielding layer 200 has a thickness of 0.03 mm to 0.04 mm. In some specific embodiments of the present disclosure, the thickness of the light shielding layer 200 is 0.03 mm, 0.035 mm, and 0.04 mm. Therefore, the thickness of the light shielding layer 200 is moderate, which can effectively shield light and save material, and at the same time facilitate assembly of the heat dissipation film 10 including the light shielding layer 200 onto the display device, which is advantageous for subsequent applications.

According to an embodiment of the present disclosure, the material of the metal layer 110 may be a metal having better thermal conductivity such as copper or silver. In some embodiments of the present disclosure, the material of the metal layer 110 is copper. As a result, the materials are widely available, readily available, and cost-effective.

According to an embodiment of the present disclosure, the metal layer 110 has a thickness of 0.03 mm to 0.05 mm. In some specific embodiments of the present disclosure, the metal layer 110 has a thickness of 0.03 mm, 0.04 mm, and 0.05 mm. The thickness of the metal layer 110 is moderate, thereby the hardness of the heat dissipating film can be made moderate, and the stamping can be prevented, so that the thermal conductivity is good, and the heat dissipating film can conduct electricity to prevent electrostatic discharge.

According to an embodiment of the present disclosure, the material of the first heat conducting layer 120 may be a heat conducting foam. The specific type of the heat conducting foam may be PU (polyurethane) foam, conductive foam, aluminum foil foam, CR foam, or the like. Thereby, the thermal conductivity is good, and the heat can be quickly derived, so that the heat dissipation performance of the heat dissipation film 10 is good.

According to an embodiment of the present disclosure, the first heat conducting layer 120 has a thickness of 0.08-0.2 mm. In some specific embodiments of the present disclosure, the first heat conducting layer 120 has a thickness of 0.08 mm, 0.1 mm, 0.12 mm, 0.14 mm, 0.16 mm, 0.18 mm, and 0.2 mm. Therefore, the thickness of the first heat conducting layer 120 is moderate, which facilitates the heat to be quickly derived and further improves the heat dissipation performance of the heat dissipation film 10.

Figure 3:
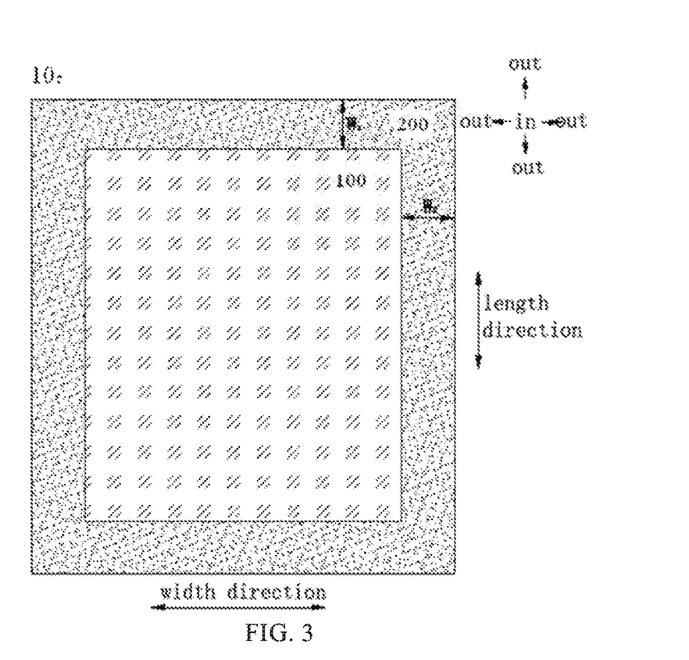
FIG. 3 is a plan structural view showing a heat dissipation film in one embodiment of the present disclosure.

According to an embodiment of the present disclosure, referring to FIGS. 2 and 3, the orthographic projection of the light shielding layer 200 in a thickness direction covers the orthographic projection of the heat conducting layer 100 in the thickness direction, and the area of the orthographic projection of the light shielding layer 200 in the thickness direction is larger than the area of the orthographic projection of the heat conducting layer 100 in the thickness direction. For example, in some embodiments of the present disclosure, referring to FIGS. 1 and 2, an outer circumferential edge of the orthographic projection of the light shielding layer 200 in the thickness direction is located outside an outer circumferential edge of the orthographic projection of the heat conducting layer 100 in the thickness direction. Thereby, light leakage can be prevented around the display device including the heat dissipation film 10.

Figure 4:
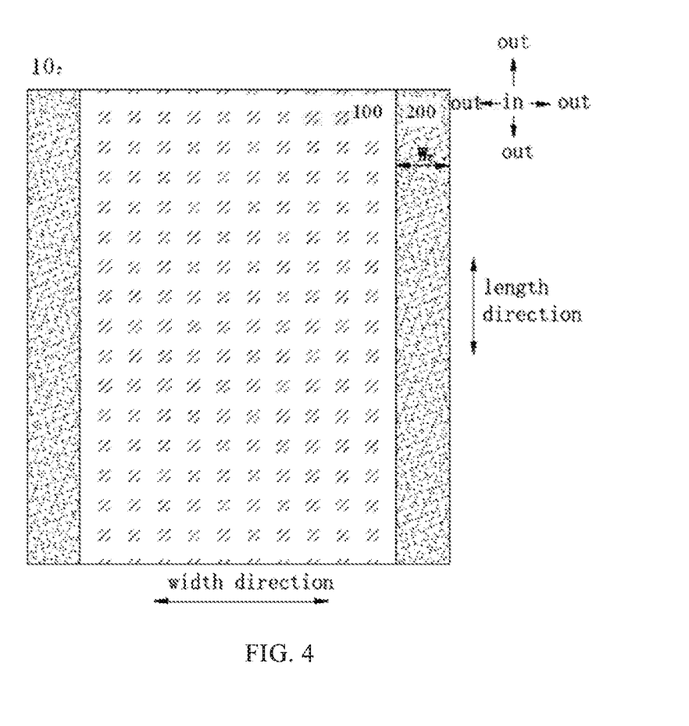
FIG. 4 is a plan structural view showing a heat dissipation film in the other one embodiment of the present disclosure.

In other embodiments of the present disclosure, referring to FIGS. 1 and 4, the two ends of the light shielding layer 200 opposite to each other in the length direction are aligned with the two ends of the heat conducting layer 100 opposite to each other in the length direction, respectively, and the two ends of the light shielding layer 200 in the width direction exceed the two ends of the heat conducting layer 100 in the width direction, respectively. In view of actual use requirements, most current display devices are wide-screen, that is, light leakage is likely to occur at both ends in the width direction, and light leakage is less likely to occur at both ends in the length direction. Therefore, the display device including the heat dissipation film 10 can be made light-tight in the width direction in which light leakage is likely to occur by providing the two ends of the light shielding layer 200 in the width direction to exceed the two ends of the heat conducting layer 100 in the width direction, respectively. Meanwhile, compared with the case that the outer circumferential edge of the orthographic projection of the light shielding layer 200 in the thickness direction is located outside the outer circumferential edge of the orthographic projection of the heat conducting layer 100 in the thickness direction, materials can be saved, costs can be reduced, production processes can be shortened, and production efficiency can be improved.

According to an embodiment of the present disclosure, referring to FIGS. 3 and 4, a distance $W_1$ that each of two ends of the light shielding layer 200 exceeding each of two ends of the heat conducting layer 100 in a length direction or a distance $W_2$ that each of two ends of the light shielding layer 200 exceeding each of two ends of the heat conducting layer 100 in a width direction is in range of 0.5 to 2 mm. Thus, the distance $W_1$ or $W_2$ is suitable for a general display device. In some specific embodiments of the present disclosure, the distances $W_1$ or $W_2$ may each independently be 0.5 mm, 1.0 mm, 1.5 mm, or 2.0 mm. Thus, such distance is suitable for general display devices and has a wide range of applications. It should be understood that the one-side excess distance $W_1$ or $W_2$ of the light shielding layer 200 in the length direction or the width direction is determined by the distance between the edge of each specific film layer and the edge of the cover plate, as long as $W_1$ or $W_2$ allows the edge of the light shielding layer to be connected to the edge of the cover plate when the heat dissipation film is assembled to the display device.

Figure 5:
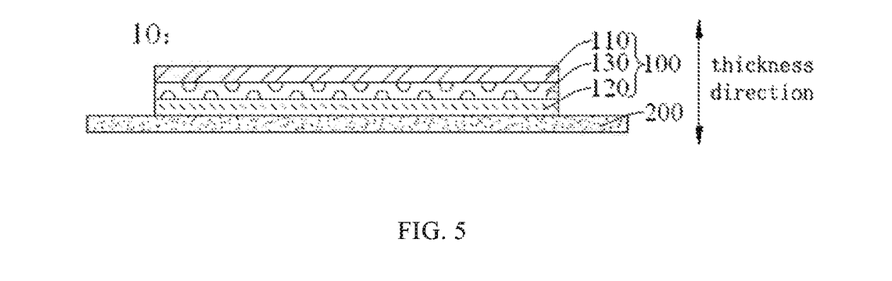
FIG. 5 is a sectional structural view showing a heat dissipation film in the other one embodiment of the present disclosure.

In other embodiments of the present disclosure, referring to FIG. 5, the heat conducting layer 100 further includes: a second heat conducting layer 130 disposed between the first heat conducting layer 120 and the metal layer 110. Thereby, the heat conduction effect of the heat dissipation film 10 can be made better.

According to an embodiment of the present disclosure, the material of the second heat conducting layer 130 may be graphite. Therefore, the second heat conducting layer 130 has an excellent coefficient of the thermal conductivity, is soft in texture and easy to cut, and is suitable for heat dissipation of various display devices, and has good heat dissipation effect.

According to an embodiment of the present disclosure, the second heat conducting layer 130 has a thickness of 0.03 mm to 0.04 mm. In some specific embodiments of the present disclosure, the second heat conducting layer 130 has a thickness of 0.03 mm, 0.035 mm, or 0.04 mm. Therefore, the thickness of the second heat conducting layer 130 is moderate, which facilitates the heat to be quickly derived and further improves the heat dissipation performance of the heat dissipation film 10.

Figure 6:
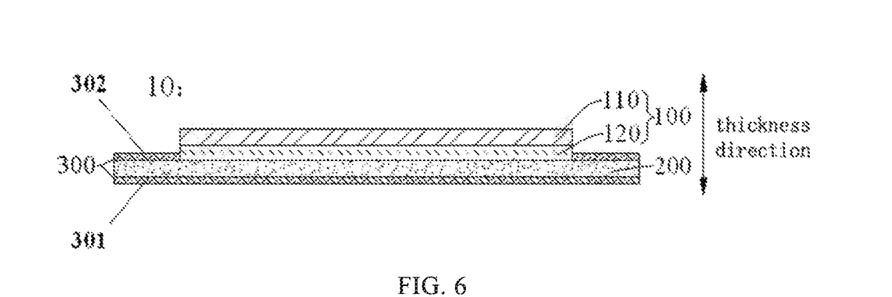
FIG. 6 is a sectional structural view showing a heat dissipation film in another embodiment of the present disclosure.
Figure 8:
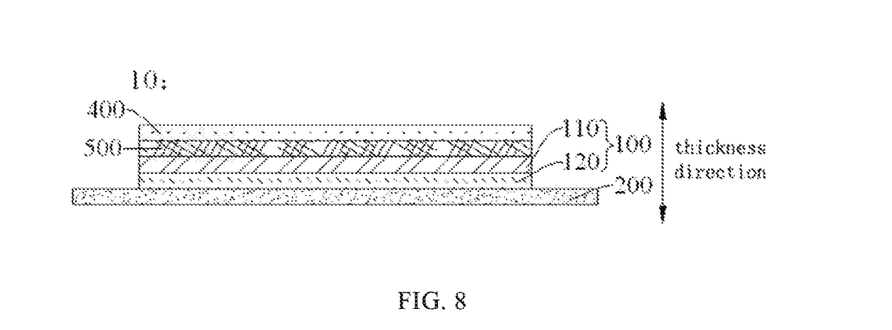
FIG. 8 is a sectional structural view showing a heat dissipation film in another one embodiment of the present disclosure.

In still other embodiments of the present disclosure, referring to FIGS. 6 and 8, the heat dissipation film 10 may further include a release layer disposed on at least a portion of an exposed surface of the heat dissipation film. The "exposed surface of the heat dissipation film" herein refers to a surface of configuration of the heat dissipation film that is in contact with the external environment. By providing a release layer on the exposed surface of the heat dissipation film, the heat dissipation film can be effectively protected from being damaged before assembly operation.

Specifically, the release layer may include: a first release layer 301 disposed on a surface of the light shielding layer 200 away from the first heat conducting layer 120, and a second release layer 302 disposed on a surface of the light shielding layer 200 adjacent to but not covered by the first heat conducting layer 120. Thereby, it is possible to protect the surface of the light shielding layer 200 from being contaminated before being assembled to the display device. Thereby, it can be assembled relatively firmly to the display device.

According to an embodiment of the present disclosure, the material of the first release layer 301 and/or the second release layer 302 may be PET, thereby protecting the light shielding layer 200 from being damaged before the heat dissipation film 10 is assembled to the display device.

According to an embodiment of the present disclosure, the first release layer 301 and/or the second release layer 302 have a thickness of 0.07 mm to 0.08 mm. In some specific embodiments of the present disclosure, the first release layer 301 and/or the second release layer 302 have a thickness of 0.07 mm, 0.075 mm, or 0.08 mm. Thus, the release layer having the above thickness is sufficient to prevent the light shielding layer from being damaged and to facilitate removal when the heat dissipation film is assembled.

Figure 7:
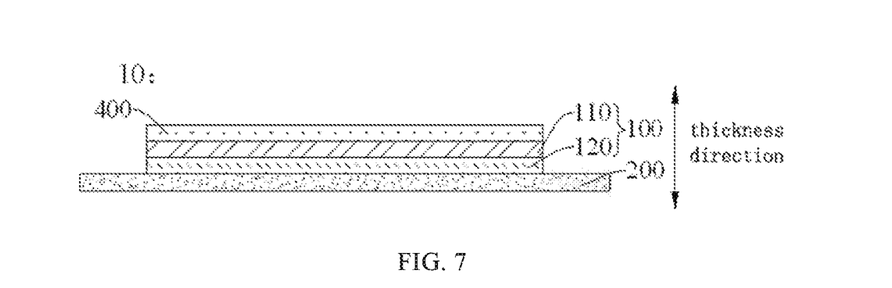
FIG. 7 is a sectional structural view showing a heat dissipation film in another one embodiment of the present disclosure.

In still other embodiments of the present disclosure, referring to FIG. 7, the release layer further includes a third release layer 400 disposed on a surface of the metal layer 110 away from the first heat conducting layer 120. Thereby, the metal layer 110 can be protected from contamination during processing. The third release layer here may also be referred to as a protective layer.

According to an embodiment of the present disclosure, the material of the third release layer 400 may be polyethylene terephthalate (PET). As a result, the materials are widely available, readily available, and cost-effective, thin in thickness, and easy to remove, which is advantageous for subsequent applications.

According to an embodiment of the present disclosure, the third release layer 400 has a thickness of 0.04 mm to 0.05 mm. In some specific embodiments of the present disclosure, the third release layer 400 has a thickness of 0.04 mm, 0.045 mm, or 0.05 mm. As a result, the materials are widely available, readily available, and cost-effective.

In still other embodiments of the present disclosure, referring to FIG. 8, the heat dissipation film 10 further includes: an adhesive layer 500 disposed between the metal layer 110 and the third release layer 400.

According to an embodiment of the present disclosure, the material of the adhesive layer 500 may be a synthetic resin, a rubber, or the like. Glue with relatively high viscosity may be used as the adhesive layer. Thereby, the heat dissipation film can be assembled relatively firmly to the display device.

According to an embodiment of the present disclosure, the adhesive layer 500 may have a thickness of 0.02 mm to 0.03 mm. In some specific embodiments of the present disclosure, the adhesive layer 500 may have a thickness of 0.02 mm, 0.025 mm, or 0.03 mm. Therefore, it is advantageous to mount the heat dissipation film 10 on the display device, and the adhesion is firm, which is advantageous for subsequent applications.

Figure 9:
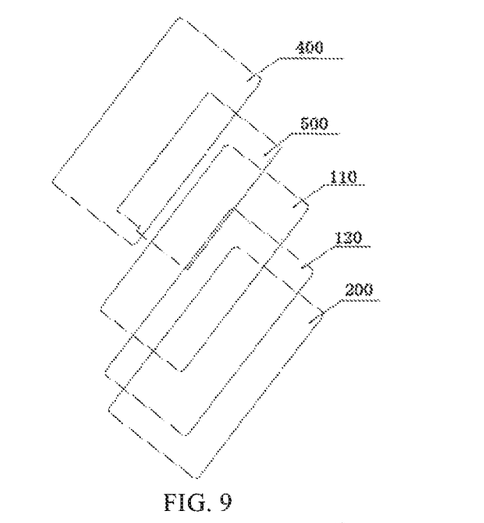
FIG. 9 is an exploded view showing a heat dissipating film structure in one embodiment of the present disclosure.

In still other embodiments of the present disclosure, referring to FIG. 9, the heat dissipation film 10 may include a third release layer 400, a adhesive layer 500, a metal layer 110, a second heat conducting layer 130 (not shown), a first heat conducting layer 120, a first release layer 301 (not shown), a second release layer 302 (not shown), and a light shielding layer 200. In this embodiment, the two ends of the light shielding layer 200 opposite to each other in the length direction are aligned with the two ends of the heat conducting layer 100 opposite to each other in the length direction, respectively, and the two ends of the light shielding layer 200 in the width direction exceed the two ends of the heat conducting layer 100 in the width direction, respectively. Therefore, the display device including the heat dissipation film 10 can be made light-tight in the width direction in which light leakage is likely to occur, materials can be saved, costs can be reduced, production processes can be simplified, and production efficiency can be improved.

According to the disclosed embodiments, those skilled in the art can understand that among the first release layer 301, the second release layer 302, the second heat conducting layer 130, and the third release layer 400 described above, the heat dissipation film 10 of the present disclosure may include any one of them, or may also include several of them. The present disclosure is not limited thereto, and those skilled in the art may flexibly select according to actual use requirements.

Figure 10:
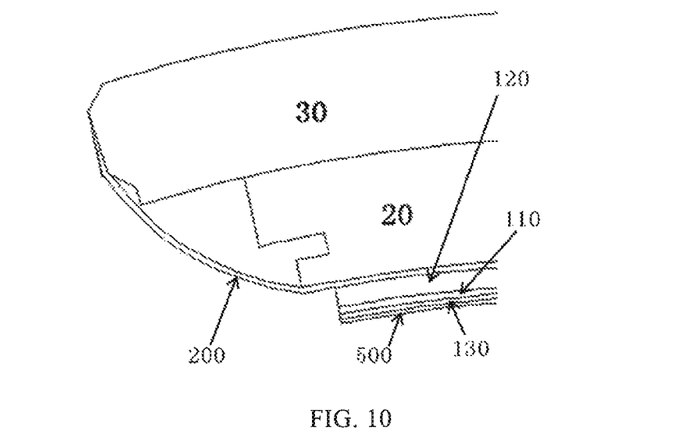
FIG. 10 is a sectional structural view showing a portion of a display device in one embodiment of the present disclosure.

In another aspect of the disclosure, the present disclosure provides a display device. According to an embodiment of the present disclosure, referring to FIG. 10, the display device includes: a cover plate 30, a display panel 20 disposed on an inner surface of the cover plate 30; and the heat dissipation film described above. The heat dissipation film is disposed on a surface of the display panel 20 away from the cover plate 30, and an edge of a surface of the light shielding layer 200 adjacent to the display panel 20 is connected to an edge of the cover plate 30. Since the area of the orthographic projection of the light shielding layer 200 of the heat dissipation film 10 in the thickness direction is larger than the area of the orthographic projection of the heat conducting layer 100 in the thickness direction, when the heat dissipation film 10 is assembled on the display device, the light shielding layer of the heat dissipation film 10 can block the blank existing at the edge of the cover plate of the display device in the related art. Meanwhile, the edge of the surface of the light shielding layer 200 adjacent to the display panel 20 is connected to an edge of the cover plate 30, which can also enhance the strength of the display device, thereby improving the anti-impact performance of the display device. Therefore, the display device can prevent the light leakage, obtain good sealing property and anti-impact performance, and the manufacturing process is simple. All of the features and advantages of the heat dissipation film 10 described above can be obtained by the display device and are not described herein.

Figure 11:
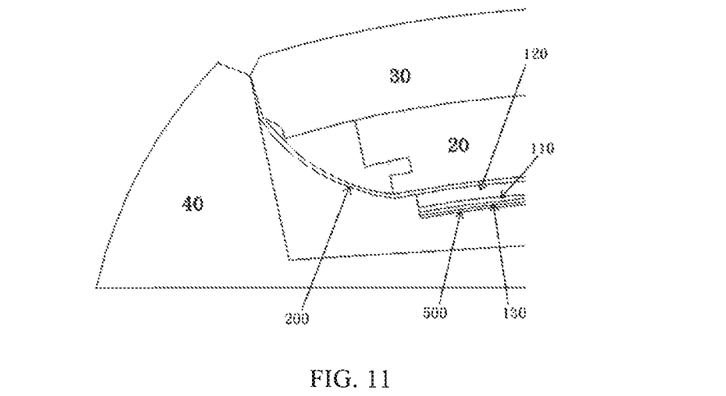
FIG. 11 is a sectional structural view showing a portion of a display device in other one embodiment of the present disclosure.

According to an embodiment of the present disclosure, referring to FIG. 11, the display device further includes a middle frame 40 disposed around the display panel, and an edge of a surface of the light shielding layer 200 away from the display panel is connected to the middle frame 40. By disposing the middle frame 40 being connected to the edge of the surface of the light shielding layer 200 away from the display panel, the display device can be protected, the strength of the display device is improved, and the anti-impact performance of the display device is further improved.

Figure 12:
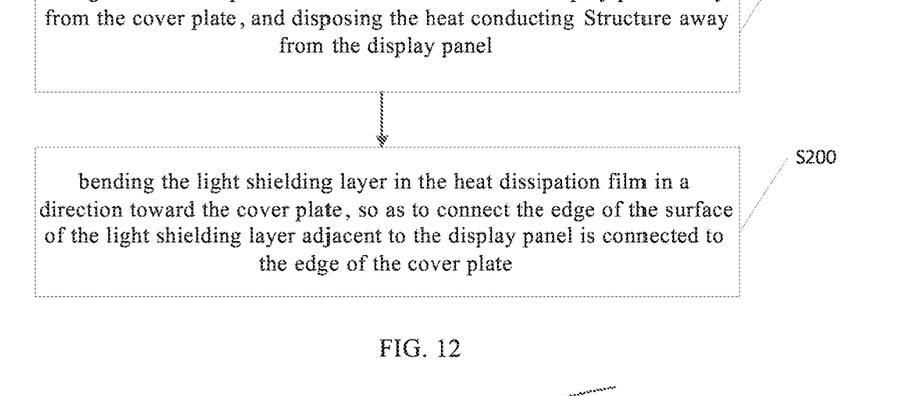
FIG. 12 is a flow chart showing a manufacturing method of a display device in one embodiment of the present disclosure.
Figure 13A:
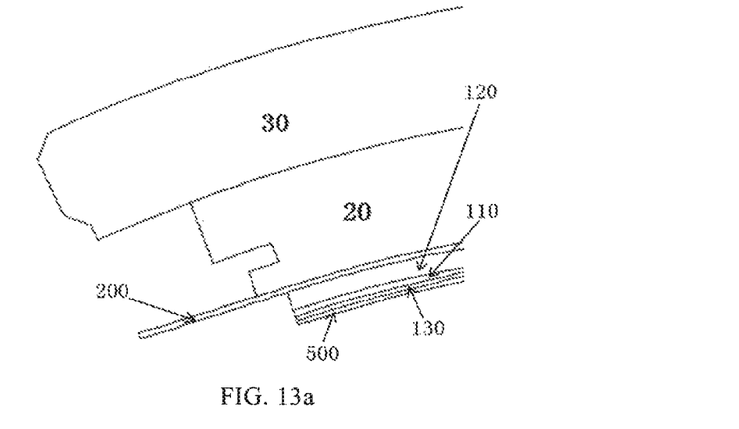
FIGS. 13a and 13b are sectional structural view showing a manufacturing method of a display device in another embodiment of the present disclosure.

In yet another aspect of the present disclosure, the present disclosure provides a manufacturing method of the display device. According to an embodiment of the present disclosure, referring to FIG. 12 and FIGS. 13a to 13b, the method includes the following steps:

S100: fixing the heat dissipation film 10 on the surface of the display panel 20 away from the cover plate 30, and disposing the heat conducting layer 100 in the heat dissipation film 10 away from the display panel. The schematic structural view is shown in FIG. 13a.

According to an embodiment of the present disclosure, when the heat dissipation film 10 is fixed on the surface of the display panel 20 away from the cover plate 30, the light shielding layer 200 is firstly placed on the side closest to the display panel 20, and then the light shielding layer 200 is attached to the surface of the display panel 20 away from the cover 30.

According to an embodiment of the present disclosure, a specific process of attaching the heat dissipation film 10 to the display panel 20 may be attaching by a roller. Thereby, the heat dissipation film 10 can be attached to the display panel 20 more firmly.

According to an embodiment of the present disclosure, when the heat dissipation film 10 is attached to the display panel 20, a mark may be added to the heat dissipation film 10 for alignment. Thereby, attachment accuracy can be ensured to be more accurate, and the defects of the fitting tolerance do not occur, further ensuring that the light shielding layer 200 can completely function as a light shielding. Optionally, the mark can be marked on the metal layer. Since the metal layer is not easily deformed compared to the heat conducting layer, setting the mark on the metal layer is advantageous for ensuring the attachment accuracy.

In some embodiments of the present disclosure, the light shielding layer 200 is a black tape layer and the heat dissipation film 10 further includes the first release layer 301 and the second release layer 302. In this case, when the heat dissipation film 10 is attached to the surface of the display panel 20, the light shielding layer 200 can be directly attached to the display panel after the first release layer 301 and the second release layer 302 are removed. In this way the attachment is firm.

Figure 13B:
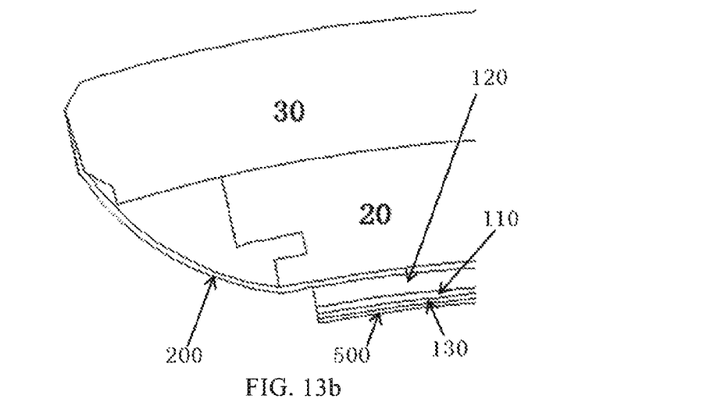

S200: bending the light shielding layer 200 in the heat dissipation film 10 in a direction toward the cover plate 30, so as to connect the edge of the surface of the light shielding layer 200 adjacent to the display panel 20 to the edge of the cover plate 30. The schematic structural view is shown in FIG. 13b.

According to an embodiment of the present disclosure, when the light shielding layer 200 in the heat dissipation film 10 is bent toward the cover plate 30, steps may include: gluing the edge of the surface of the light shielding layer 200 in the heat dissipation film 10 adjacent to the display panel 30, and then bending the light shielding layer 200 until the edge of the surface of the light shielding layer 200 adjacent to the display panel 20 is connected to the edge of the cover plate.

In some embodiments of the present disclosure, the light shielding layer 200 may be a black tape layer. Therefore, the step of gluing the edge of the surface of the light shielding layer 200 can be omitted. The bent light shielding layer 200 can be directly attached to the edge of the cover plate 30, which is simple and convenient to operate, and saves the production process, and improves production efficiency.

Figure 14:
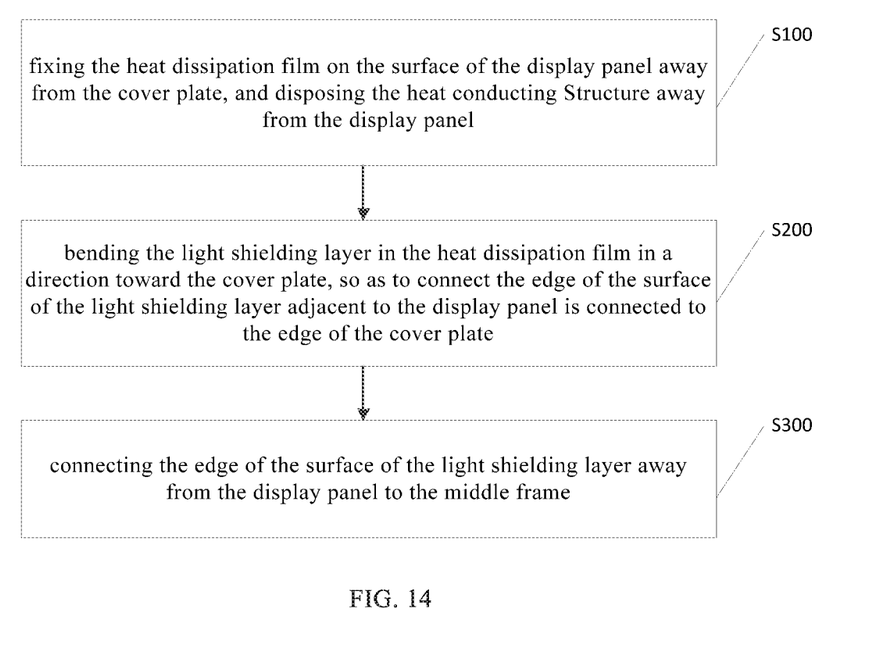
FIG. 14 is a flow chart showing a manufacturing method of a display device in an embodiment of the present disclosure.

In still other embodiments of the present disclosure, referring to FIGS. 11 and 14, the display device includes the middle frame 40 disposed around the display panel 20, and the method further includes:

S300: connecting the edge of the surface of the light shielding layer 200 away from the display panel 20 to the middle frame 40. The schematic structural view is shown in FIG. 11.

According to an embodiment of the present disclosure, after the step that bending the light shielding layer 200 in the heat dissipation film 10 in a direction toward the cover plate 30 so as to connect the edge of the surface of the light shielding layer 200 adjacent to the display panel 20 to the edge of the cover plate 30, one side of the heat dissipation film 10 away from the display panel 20 is connected to the middle frame 40. Thereby, one side of the edge of the light shielding layer 200 in the heat dissipation film 10 is connected to the edge of the cover plate 30, and the other side thereof is connected to the middle frame 40, so that the display device can be further made firmer and the anti-impact performance is good.

According to an embodiment of the present disclosure, the step that connecting the edge of the surface of the light shielding layer 200 away from the display panel 20 to the middle frame 40 can be made by gluing the edge of the surface of the light shielding layer 200 away from the display panel 20, so as to connect the middle frame 40. As a result, the connection is firm and the anti-impact performance is good.

In some embodiments of the present disclosure, the light shielding layer 200 is a black tape layer and the heat dissipation film 10 further includes the first release layer 301 and the second release layer 302. In this case, when the heat dissipation film 10 is attached to the surface of the display panel 20, the edge of the light shielding layer 200 can be directly attached to the edge of the middle frame 40 after the first release layer 301 and the second release layer 302 are removed. In this way, the attachment is relatively firm, eliminating the step of applying glue or attaching black tape, the process is simple, and there is no problem of the fit tolerance, saving labor and material resources, and greatly improving production efficiency.

In the description of the present disclosure, it is to be understood that the terms "center", "longitudinal", "transverse", "length", "width", "thickness", "up", "down", "front", "back", "left", "right", "vertical", "horizontal", "top", "bottom", "inside", "outside", "clockwise", "counter clockwise", "axial", "radial", "circumferential" and other indications is based on the orientation or position relationship shown in the attached drawings, which is only for the convenience of describing the disclosure and simplifying the description, rather than indicating or implying that the device or element referred to must have a specific orientation, be constructed and operated in a specific orientation, thus it cannot be understood as a limitation of the disclosure.

In addition, the terms "first" and "second" are used for descriptive purposes only and cannot be understood as indicating or implying relative importance or implying the number of indicated technical features. Thus, a feature defined as "first" or "second" may explicitly or implicitly include one or more such features. In the description of the present disclosure, "multiple" means two or more, unless otherwise specifically defined.

In the present disclosure, unless otherwise specified and defined, the terms "installation", "connection", "coupling", "fixation" and other terms shall be understood in a broad sense. For example, the terms may be fixed connection, detachable connection, or integrated; may be mechanical connection, or electrical connection; may be direct connection, or indirectly connected through intermediate media; or may be inner connection or interaction between two components. For those skilled in the art, the specific meaning of the above terms in the disclosure can be understood according to the specific situation.

In the present disclosure, unless otherwise specified and defined, the first feature "on" or "under" the second feature may be a direct contact of the first and second features, or the first and second features may be indirectly contact through an intermediate medium. Moreover, the first feature "above" the second feature may be that the first feature is directly or obliquely above the second feature, or merely that the level of the first feature is higher than that of the second feature. The first feature "below" the second feature may be that the first feature is directly or obliquely below the second feature, or merely that the level of the first feature is lower than that of the second feature.

In the description of the present specification, the description with reference to the terms "one embodiment", "some embodiments", "example", "specific example", or "some examples" and the like means that the specific features, structures, materials or characteristics described in combination with the embodiments or examples are included in at least one embodiment or example of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the specification, as well as features of various embodiments or examples, may be combined.

Although the embodiments of the present disclosure have been shown and described above, it is understood that the above embodiments are exemplary and cannot be understood as limitations of the present disclosure. Those skilled in the art can change, modify, replace and transform the above embodiments within the scope of the present disclosure.

The invention claimed is:

1. A heat dissipation film for a display device, comprising:
a heat conducting layer and a light shielding layer;
wherein, an orthographic projection of the light shielding layer in a thickness direction covers an orthographic projection of the heat conducting layer in the thickness direction, and an area of the orthographic projection of the light shielding layer in the thickness direction is larger than an area of the orthographic projection of the heat conducting layer in the thickness direction,
wherein the heat conducting layer comprises a metal layer and a first heat conducting layer, the metal layer being disposed on a surface of the first heat conducting layer away from the light shielding layer,
wherein the heat dissipation film further comprises a release layer disposed on at least a portion of an exposed surface of the heat dissipation film, and
wherein the release layer comprises: a first release layer disposed on a surface of the light shielding layer away from the first heat conducting layer, and a second release layer disposed on a surface of the light shielding layer adjacent to but not covered by the first heat conducting layer.

2. The heat dissipation film according to claim 1, wherein the light shielding layer is a black tape layer.

3. The heat dissipation film according to claim 2, wherein an outer circumferential edge of the orthographic projection of the light shielding layer in the thickness direction is located outside an outer circumferential edge of the orthographic projection of the heat conducting layer in the thickness direction.

4. The heat dissipation film according to claim 3, wherein a distance that each of two ends of the light shielding layer in a width direction exceeding each of two ends of the heat conducting layer in a width direction is in range of 0.5 to 2 mm.

5. The heat dissipation film according to claim 4, wherein a distance that each of two ends of the light shielding layer in a length direction exceeding each of two ends of the heat conducting layer in a length direction is in range of 0.5 to 2 mm.

6. The heat dissipation film according to claim 4, wherein the two ends of the light shielding layer opposite to each other in the length direction are aligned with the two ends of the heat conducting layer opposite to each other in the length direction, respectively, and the two ends of the light shielding layer in the width direction exceed the two ends of the heat conducting layer in the width direction, respectively.

7. The heat dissipation film according to claim 1, wherein the release layer further comprises a third release layer disposed on a surface of the metal layer away from the first heat conducting layer.

8. The heat dissipation film according to claim 7, further comprising:
an adhesive layer disposed between the metal layer and the third release layer.

9. The heat dissipation film according to claim 8, wherein the heat conducting layer further comprises:
a second heat conducting layer disposed between the first heat conducting layer and the metal layer.

10. A display device comprising:
a cover plate,
a display panel disposed on an inner surface of the cover plate; and
the heat dissipation film according to claim 1, wherein the heat dissipation film is disposed on a surface of the display panel away from the cover plate, and
an edge of a surface of the light shielding layer adjacent to the display panel is connected to an edge of the cover plate.

11. The display device according to claim 10, further comprising:
a middle frame disposed around the display panel, wherein an edge of a surface of the light shielding layer away from the display panel is connected to the middle frame.

12. A manufacturing method of the display device according to claim 10, comprising:
fixing the heat dissipation film on the surface of the display panel away from the cover plate, and disposing the heat conducting layer in the heat dissipation film away from the display panel; and
bending the light shielding layer in the heat dissipation film in a direction toward the cover plate, so as to connect the edge of the surface of the light shielding layer adjacent to the display panel to the edge of the cover plate.

13. The manufacturing method according to claim 12, wherein the display device comprises the middle frame disposed around the display panel, the manufacturing method further comprising:
connecting the edge of the surface of the light shielding layer away from the display panel to the middle frame.

* * * * *